United States Patent
Jeong et al.

(10) Patent No.: US 7,589,994 B2
(45) Date of Patent: Sep. 15, 2009

(54) METHODS OF WRITING DATA TO MAGNETIC RANDOM ACCESS MEMORY DEVICES WITH BIT LINE AND/OR DIGIT LINE MAGNETIC LAYERS

(75) Inventors: Won-Cheol Jeong, Seoul (KR); Jae-Hyun Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/171,893

(22) Filed: Jul. 11, 2008

(65) Prior Publication Data

US 2008/0273377 A1 Nov. 6, 2008

Related U.S. Application Data

(62) Division of application No. 11/092,362, filed on Mar. 29, 2005, now abandoned.

(30) Foreign Application Priority Data

Jul. 14, 2004 (KR) .............................. 2004-54939

(51) Int. Cl.
G11C 11/00 (2006.01)
(52) U.S. Cl. .................. 365/158; 365/171; 365/173
(58) Field of Classification Search ................ 365/158, 365/171, 173
See application file for complete search history.

(56) References Cited

U.S. PATENT DOCUMENTS

| 6,097,625 | A | 8/2000 | Scheuerlein |
| 6,130,814 | A | 10/2000 | Sun |
| 6,163,477 | A | 12/2000 | Tran |
| 6,236,590 | B1 | 5/2001 | Bhattacharyya et al. |
| 6,385,082 | B1 | 5/2002 | Abraham et al. |
| 6,385,083 | B1 | 5/2002 | Sharma et al. |
| 6,430,085 | B1 | 8/2002 | Rizzo |

(Continued)

FOREIGN PATENT DOCUMENTS

JP 2001-084757 3/2001

(Continued)

OTHER PUBLICATIONS

Boeck et al. "Spintronics, a New Nanoelectronics Adventure" *thinfilmmfg.com* 5 pages (2002) <http://www.thinfilmmfg.com/subscribers/Subcriber02/spin1May02.htm> Accessed online on May 20, 2005.

(Continued)

*Primary Examiner*—Son Dinh
*Assistant Examiner*—Nam Nguyen
(74) *Attorney, Agent, or Firm*—Myers Bigel Sibley & Sajovec, P.A.

(57) ABSTRACT

A magnetic random access memory (MRAM) device may include a substrate, a first magnetic layer on the substrate, and a digit line on the first magnetic layer. A magnetic tunnel junction structure may be provided adjacent the digit line, and a bit line may be provided on the magnetic tunnel junction structure such that the magnetic tunnel junction structure is between the bit line and the digit line. In addition, a second magnetic layer may be provided on the bit line.

10 Claims, 6 Drawing Sheets

U.S. PATENT DOCUMENTS

| | | | |
|---|---|---|---|
| 6,509,621 B2 | 1/2003 | Nakao | |
| 6,545,906 B1 | 4/2003 | Savtchenko et al. | |
| 6,560,135 B2 | 5/2003 | Matsuoka et al. | |
| 6,603,677 B2 | 8/2003 | Redon et al. | |
| 6,603,678 B2 | 8/2003 | Nickel et al. | |
| 6,680,862 B2 | 1/2004 | Hidaka | |
| 6,720,597 B2 | 4/2004 | Janesky et al. | |
| 6,724,651 B2 | 4/2004 | Hirai | |
| 6,724,674 B2 | 4/2004 | Abraham et al. | |
| 6,744,651 B2 | 6/2004 | Tang | |
| 6,760,251 B2 | 7/2004 | Hidaka | |
| 6,762,953 B2 | 7/2004 | Tanizaki et al. | |
| 6,771,534 B2 | 8/2004 | Stipe | |
| 6,781,874 B2 | 8/2004 | Hidaka | |
| 6,791,874 B2 | 9/2004 | Tran et al. | |
| 6,794,696 B2 | 9/2004 | Fukuzumi | |
| 6,803,619 B2 | 10/2004 | Hosotani et al. | |
| 6,842,361 B2 | 1/2005 | Miyatke et al. | |
| 6,870,757 B2 | 3/2005 | Hidaka | |
| 6,894,919 B2 | 5/2005 | Fukuzumi | |
| 6,898,113 B2 | 5/2005 | Tsuji | |
| 6,909,630 B2 | 6/2005 | Tsang | |
| 6,947,314 B2 | 9/2005 | Yoda et al. | |
| 6,947,315 B2 | 9/2005 | Iwata | |
| 6,952,364 B2 | 10/2005 | Lee et al. | |
| 6,954,374 B2 | 10/2005 | Hidaka | |
| 6,956,763 B2 * | 10/2005 | Akerman et al. | 365/158 |
| 6,970,378 B2 | 11/2005 | Hidaka | |
| 6,992,924 B2 | 1/2006 | Miyatake et al. | |
| 6,992,935 B2 | 1/2006 | Ooishi | |
| 6,999,340 B2 | 2/2006 | Shimizu | |
| 6,999,341 B2 | 2/2006 | Ooishi | |
| 6,999,342 B2 | 2/2006 | Ooishi | |
| 7,009,873 B2 | 3/2006 | Yoda et al. | |
| 7,009,877 B1 | 3/2006 | Huai et al. | |
| 7,068,536 B2 | 6/2006 | Matsutera et al. | |
| 7,092,283 B2 | 8/2006 | Jeong et al. | |
| 7,095,648 B2 | 8/2006 | Ditewig et al. | |
| 7,105,879 B2 | 9/2006 | Lin et al. | |
| 7,164,598 B2 | 1/2007 | Jeong et al. | |
| 7,206,222 B2 | 4/2007 | Hidaka | |
| 2002/0145902 A1 | 10/2002 | Kunikiyo et al. | |
| 2002/0176277 A1 | 11/2002 | Bessho et al. | |
| 2003/0170976 A1 | 9/2003 | Molla et al. | |
| 2004/0256688 A1 | 12/2004 | Braun | |
| 2005/0073878 A1 | 4/2005 | Lin et al. | |
| 2005/0078510 A1 | 4/2005 | Jeong et al. | |
| 2006/0034117 A1 | 2/2006 | Jeong et al. | |

FOREIGN PATENT DOCUMENTS

| | | |
|---|---|---|
| JP | 2001-084758 | 3/2001 |
| JP | 2001-250206 | 9/2001 |
| JP | 2002-319664 | 10/2002 |
| JP | 2004-087519 | 3/2004 |
| KR | 1020020046036 | 6/2002 |
| KR | 1020020054656 | 7/2002 |
| KR | 1020030040027 | 5/2003 |
| KR | 1020030062280 | 7/2003 |
| KR | 1020040003479 | 1/2004 |
| KR | 1020040026619 | 3/2004 |
| KR | 1020040038420 | 5/2004 |
| KR | 1020040041335 | 5/2004 |
| KR | 1020040042917 | 5/2004 |
| WO | WO 2004/049344 | 6/2004 |

OTHER PUBLICATIONS

Deak "Spin Injection in Thermally Assisted Magnetic Random Access Memory" 15 pages <http://www.nve.com/advpdf/49th_MMM_spin_injection_TA_MRAM.pdf> Accessed online on Jun. 20, 2005.

Fert et al. "The New Era of Spintronics" *Europhysics News* 34(6) 7 pages (2003) <http://www.europhysicsnews.com/full/24/article9/article9.html> Accessed online on Jun. 20, 2005.

Johnson "Magnetic Spin Locks data into MRAMs" *EETimes Online* (Jul. 17, 2001) 4 pages <http://www.eetimes.com/story/OEG20010717S0064> Accessed online on Apr. 18, 2005.

Office Action issued by the Korean Intellectual Property Office for Korean Application No. 10-2004-0054939 on Nov. 30, 2005.

* cited by examiner

METHODS OF WRITING DATA TO MAGNETIC RANDOM ACCESS MEMORY DEVICES WITH BIT LINE AND/OR DIGIT LINE MAGNETIC LAYERS

RELATED APPLICATIONS

The present application claims the benefit of priority as a divisional of U.S. application Ser. No. 11/092,362 filed Mar. 29, 2005 now abandoned, which claims the benefit of and priority to Korean Patent Application No. 2004-0054939, filed Jul. 14, 2004. The disclosures of both of the above-referenced applications are incorporated herein in their entirety by reference.

FIELD OF THE INVENTION

The present invention relates to the field of semiconductor memory devices and, more particularly, to magnetic random access memory devices and methods.

BACKGROUND

A magnetic random access memory (MRAM) is a nonvolatile memory device that uses a magnetoresistance effect such that resistance of an electric conductor is changed in response to a circumferential magnetic field to thereby store information. An MRAM may include a plurality of MRAM cells with each MRAM cell including a magnetic tunnel junction (MTJ) on a single transistor.

An MTJ may include multiple thin layers such that electrons may tunnel through a very thin insulating layer sandwiched between two ferromagnetic electrodes when an external electrical signal is applied. A top electrode may be referred to as a free layer and a bottom electrode may be referred to as a pinned layer.

When magnetization directions within the free layer and the pinned layer are arranged parallel with respect to each other, a tunneling current flowing through the MTJ may have a relatively high value, and, the tunneling resistance may have a relatively low value. In contrast, when the magnetization directions within the free layer and the pinned layer are arranged anti-parallel with respect to each other, a tunneling current flowing through the MTJ may have a reduced value, and a tunneling resistance may have a relatively high value.

An MRAM may use magnetic charges to store information while a conventional memory may use electrical charges. Digital data represented as "0" and "1" may thus be differentiated to store a low resistance state where the magnetization directions of the two electrodes are parallel with respect to each other and a high resistance state where the magnetization directions are anti-parallel with respect to each other.

An anti-ferromagnetic layer which may be referred to as a pinning layer may be added to the pinned layer. The pinning layer may serve to fix the magnetization direction of the pinned layer. More particularly, the pinned layer attached to the pinning layer may have a relatively large switching field, and the magnetization direction of the pinned layer may be fixed always in a same direction when an applied magnetic field is smaller than the switching field. Thus, data of the MRAM cell may be determined by the magnetization direction within the free layer. The magnetization direction of the free layer may be changed by applying a magnetic field to its circumference. To change the magnetization direction of the free layer to a desired direction, conductive layers such as a bit line and a digit line may be formed to be orthogonal with respect to each other above/below the MTJ, and a current may flow through each conductive layer. A magnetic field induced by the current may be used to change the magnetization direction.

In this case, when the magnetization direction of an MTJ selected to store data is changed, a magnetization direction of an MTJ which is not selected should not be changed. To enhance integration density within a limited space, however, not only the size of each MTJ but also spaces between MTJs should be reduced. As a result of reductions in space between MTJs, a magnetic field which is generated to change a magnetization direction of a selected MTJ may increasingly affect adjacent MTJs which are not selected. If this effect becomes sufficient to invert a magnetization direction of adjacent MTJs, it may not be possible to perform a normal data storage operation.

To cope with the above-mentioned problems, alternate writing methods referred to as toggle switching have been proposed. A writing method for MRAMs using toggle switching is disclosed in U.S. Pat. No. 6,545,906 entitled "Method of writing to scalable magnetoresistance random access memory element" to Savtchenko et al. The disclosure of U.S. Pat. No. 6,545,906 is hereby incorporated herein in its entirety by reference.

According to U.S. Pat. No. 6,545,906, a digit line may be provided above a predetermined region of a semiconductor substrate. A bit line may be disposed on the digit line and may cross the digit line. An MTJ may be interposed at an intersection of the digit line and the bit line. The MTJ may include a second magnetic region, a tunneling barrier, and a first magnetic region which are sequentially stacked. Each of the first and second magnetic regions may include a synthetic anti-ferromagnetic (SAF) structure. The SAF structure may be formed of a top ferromagnetic layer, a bottom ferromagnetic layer, and an anti-ferromagnetic coupling spacer layer interposed therebetween.

FIG. 1 is a switching characteristic diagram of an MRAM cell fabricated as discussed in with U.S. Pat. No. 6,545,906.

Referring to FIG. 1, the horizontal axis indicates a magnetic field (Hw) induced on the bit line measured in units of Oersted (Oe) which is a unit of magnetoresistance and which is proportional to the magnitude of the bit line current. The longitudinal axis indicates a magnetic field (Hw) induced on the digit line also measured in units of Oersted (Oe). There are three regions in the switching characteristic diagram, i.e., a no switching region 92, a direct switching region 95, and a toggle switching region 97.

A method of writing using toggle switching region 97 may begin with reading an initial state of the MTJ. For example, in the case that the initial state of the MTJ is read as "1", when a bit line positive current pulse is applied to the bit line and a digit line positive current pulse is applied to the digit line, a magnetization direction of the MTJ may be changed to write a "0" state. Next, when the bit line positive current pulse is applied again to the bit line and the digit line positive current pulse is applied again to the digit line, the magnetization direction of the MTJ may also be changed to write a "1" state. In this case, the bit line positive current pulse and the digit line positive current pulse may be applied with a time delay, but, these pluses may include a sequence which has an overlapped region therebetween. In addition, the magnitude of the current pulse may correspond to the toggle switching region 97.

The toggle switching region 97 may have a large switching region as shown in FIG. 1, but it may require a relatively high switching current. The relatively high switching current may in turn cause an undesirable increase in power consumption.

SUMMARY

According to embodiments of the present invention, a magnetic random access memory (MRAM) device may include a substrate, a first magnetic layer on the substrate, a digit line on the first magnetic layer, and a magnetic tunnel junction structure adjacent the digit line. A bit line may be provided on the magnetic tunnel junction structure such that the magnetic tunnel junction structure is between the bit line and the digit line. A second magnetic layer may be provided on the bit line.

More particularly, the magnetic tunnel junction structure may include a synthetic anti-ferromagnetic (SAF) free layer, and the synthetic anti-ferromagnetic (SAF) free layer may include an exchange spacer layer between first and second free layers such that the first free layer is between the exchange spacer layer and the digit line. The first and second free layers may include a ferromagnetic material, and the exchange spacer layer may include ruthenium. The magnetic tunnel junction structure may include a tunneling insulating layer between the synthetic anti-ferromagnetic free layer and the digit line, a pinned layer between the tunneling insulating layer and the digit line, and a pinning layer between the pinned layer and the digit line. Moreover, the pinned layer may include an exchange spacer layer between first and second pinned sub-layers such that the first pinned sub-layer is between the exchange spacer layer and the pinning layer and the second pinned sub-layer is between the exchange spacer layer and the tunneling insulating layer. Each of the first and second pinned sub-layers may include a ferromagnetic material.

In addition, portions of the first magnetic layer may be between the digit line and the substrate and portions of the first magnetic layer may extend on sidewalls of the digit line. The bit line may be between portions of the second magnetic layer and the substrate, and portions of the second magnetic layer may extend on sidewalls of the bit line. Moreover, at least one of the first magnetic layer and/or the second magnetic layer may be a permanent magnet, and/or at least one of the first magnetic layer and/or the second magnetic layer may include at least one of Co and/or CoFe. In an alternative, at least one of the first magnetic layer and/or the second magnetic layer may include an electromagnet. In addition, a longest dimension of the magnetic tunnel junction structure parallel with respect to a surface of the substrate may be arranged non-parallel with respect to the digit line and the bit line.

The magnetic random access memory device may also include an insulating passivation layer and at least two magnets. More particularly, the insulating passivation layer may be provided on the bit line such that the bit line is between the insulating passivation layer and the substrate, and the at least two magnets may be provided on the insulating passivation layer such that the insulating passivation layer is between the at least two magnets and the substrate. Moreover, each of the at least two magnets may include a permanent magnet and/or an electromagnet.

According to additional embodiments of the present invention, a magnetic random access memory (MRAM) device may include a substrate, a plurality of digit lines on the substrate, and a plurality of bit lines crossing the plurality of digit lines on the substrate. Each of a plurality of magnetic tunnel junction structures may be provided at a junction of respective digit and bit lines and between the respective digit and bit lines. An insulating passivation layer may be provided on the plurality of digit lines, on the plurality of bit lines and on the plurality of magnetic tunnel junction structures such that the plurality of digit lines, the plurality of bit lines and the plurality of magnetic tunnel junction structures are between the insulating passivation layer and the substrate. Moreover, at least two magnets may be provided on the insulating passivation layer such that the insulating passivation layer is between the at least two magnets and the substrate.

Each of the magnetic tunnel junction structures may include a respective synthetic anti-ferromagnetic free layer. Each of the synthetic anti-ferromagnetic free layers may include an exchange spacer layer between first and second free layers such that the first free layer is between the exchange spacer layer and the substrate and the second free layer is between the exchange spacer layer and the insulating passivation layer. More particularly, each of the first and second free layers may include a ferromagnetic material, and the exchange spacer layer may include ruthenium.

Each of the magnetic tunnel junction structures may include a tunneling insulating layer between the synthetic anti-ferroelectric free layer and the substrate, a pinned layer between the tunneling insulating layer and the substrate, and a pinning layer between the pinned layer and the substrate. Moreover, the pined layer may include an exchange spacer layer between first and second pinned sub-layers such that the first pinned sub-layer is between the exchange spacer layer and the pinning layer and the second pinned sub-layer is between the exchange spacer layer and the tunneling insulating layer. Each of the first and second pinned sub-layers may include a ferroelectric material.

In addition, a first plurality of cladding layers may be provided with portions of each cladding layer being provided between a respective digit line and the substrate. A second plurality of cladding layers may be provided between respective bit lines and the insulating passivation layer. Moreover, each of the cladding layers may include a ferroelectric material.

A longest dimension of each of the magnetic tunnel junction structures parallel with respect to a surface of the substrate may be arranged non-parallel with respect to the respective digit and bit lines. Each of the at least two magnets may include a permanent magnet and/or an electromagnet, and first and second ones of the at least two magnets may be orthogonal with respect to each other. In addition, the at least two magnets may includes a plurality of pairs of magnets.

Embodiments of the invention may provide relatively stable operating characteristics for MRAMs at relatively low switching currents. In one embodiment of the invention, an MRAM may include a digit line disposed above a predetermined region of a semiconductor substrate. A bottom surface and sidewalls of the digit line may be surrounded by a first magnetic layer pattern. A bit line may be disposed to cross over the digit line, and a top surface and sidewalls of the bit line may be surrounded by a second magnetic layer pattern. An MTJ may be interposed between the bit line and the digit line. The MTJ may be electrically connected to the bit line and may be insulated from the digit line. The MTJ may have a synthetic anti-ferromagnetic (SAF) free layer.

Each of the first and second magnetic layer patterns may be formed of a permanent magnet and/or an electromagnet. The permanent magnet may be formed of at least one material selected from a group consisting of Co, CoFe, and/or NiFe. A magnetic field generated by the current flowing through the digit line and the bit line may be synthesized with that generated in the first and second magnetic layer patterns, thereby producing a larger synthesized magnetic field. As a result, a relatively large magnetic field may be generated with a relatively small current.

The SAF free layer may include a bottom free layer and a top free layer which are separated by a second exchange spacer layer. Each of the bottom and top free layers may be formed of a ferromagnetic layer. The second exchange spacer layer may be a ruthenium (Ru) layer. The SAF free layer may have a characteristic that the magnetization directions of the bottom and top free layers are arranged to be anti-parallel with respect to each other due to the effect of the second exchange spacer layer. In addition, the magnetization direction of the SAF free layer may be changed by the magnetic field which is generated in the digit line and the bit line.

In another embodiment of the invention, an MRAM may include a digit line disposed above a predetermined region of a semiconductor substrate. A bit line may be disposed to cross over the digit line. An MTJ may be interposed between the bit line and the digit line. The MTJ may be electrically connected to the bit line and may be insulated from the digit line, and the MTJ may have a SAF free layer. A passivation insulating layer may be provided to cover the bit line. At least one pair of external magnets may be disposed on the semiconductor substrate covered by the passivation insulating layer.

DETAILED DESCRIPTION

Figure 1:
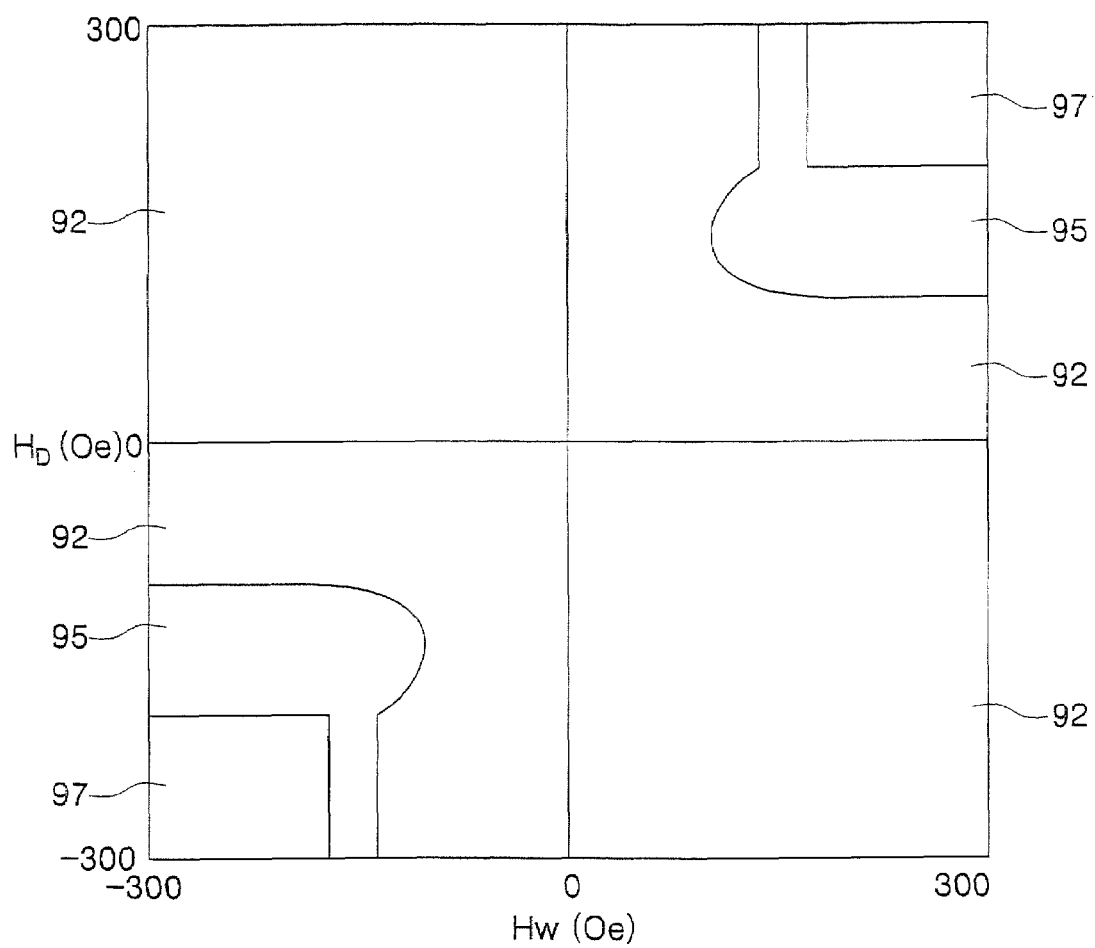
FIG. 1 is a switching characteristic diagram of a conventional MRAM cell.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
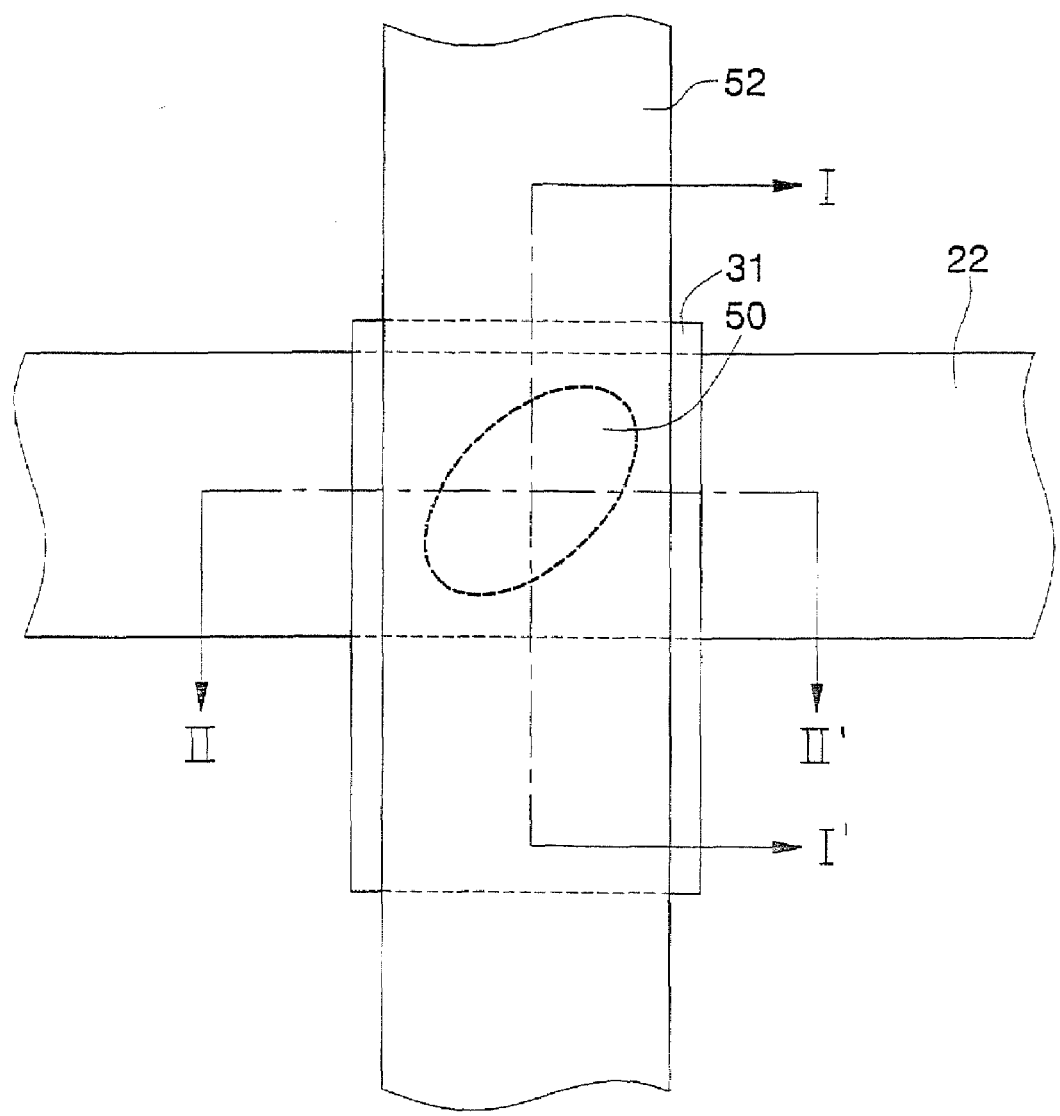
FIG. 2 is a plan view illustrating MRAM cells according to embodiments of the present invention.
Figure 3:
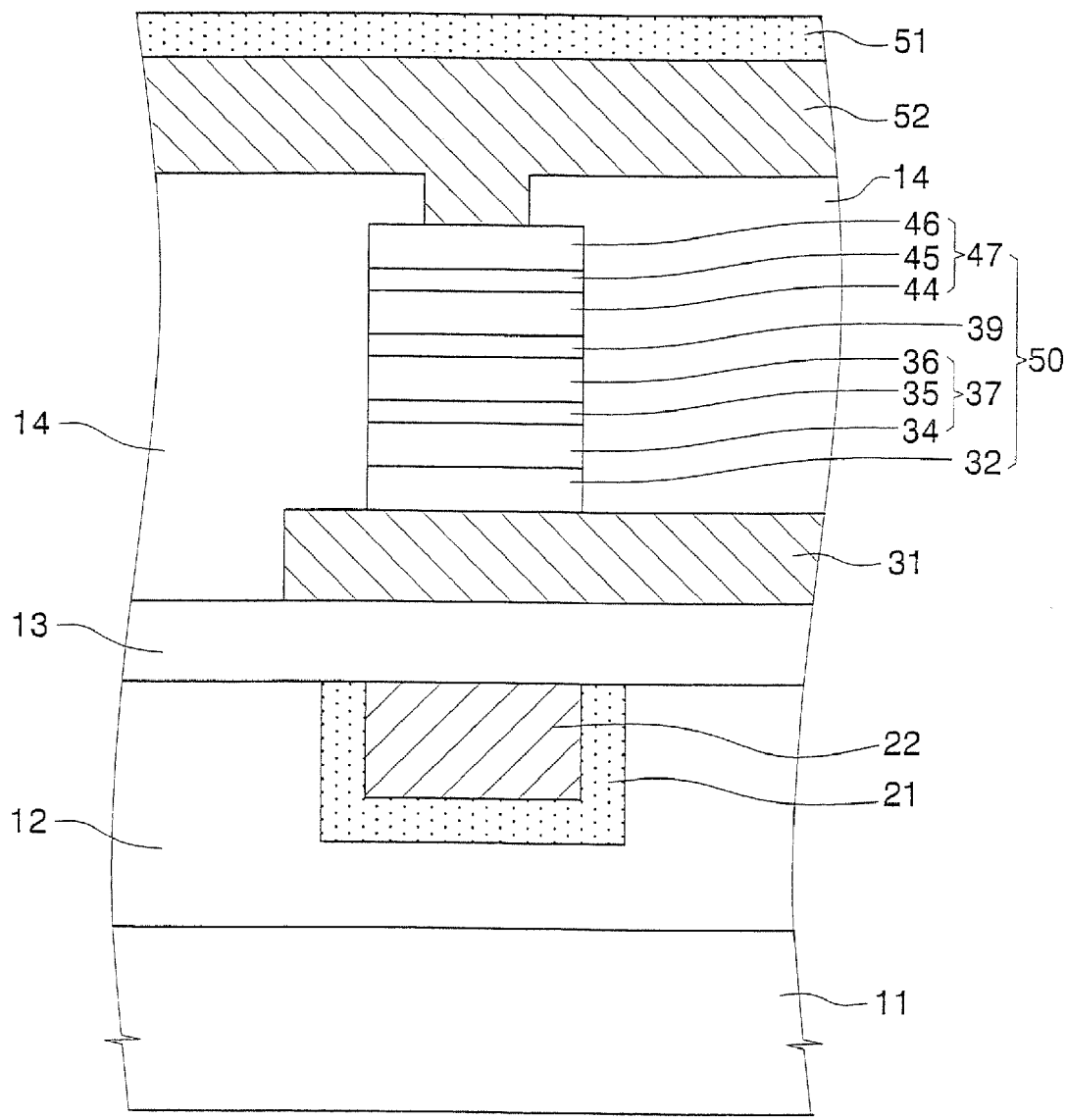
FIG. 3 is a cross-sectional view taken along the line I-I' of FIG. 2.
Figure 4:
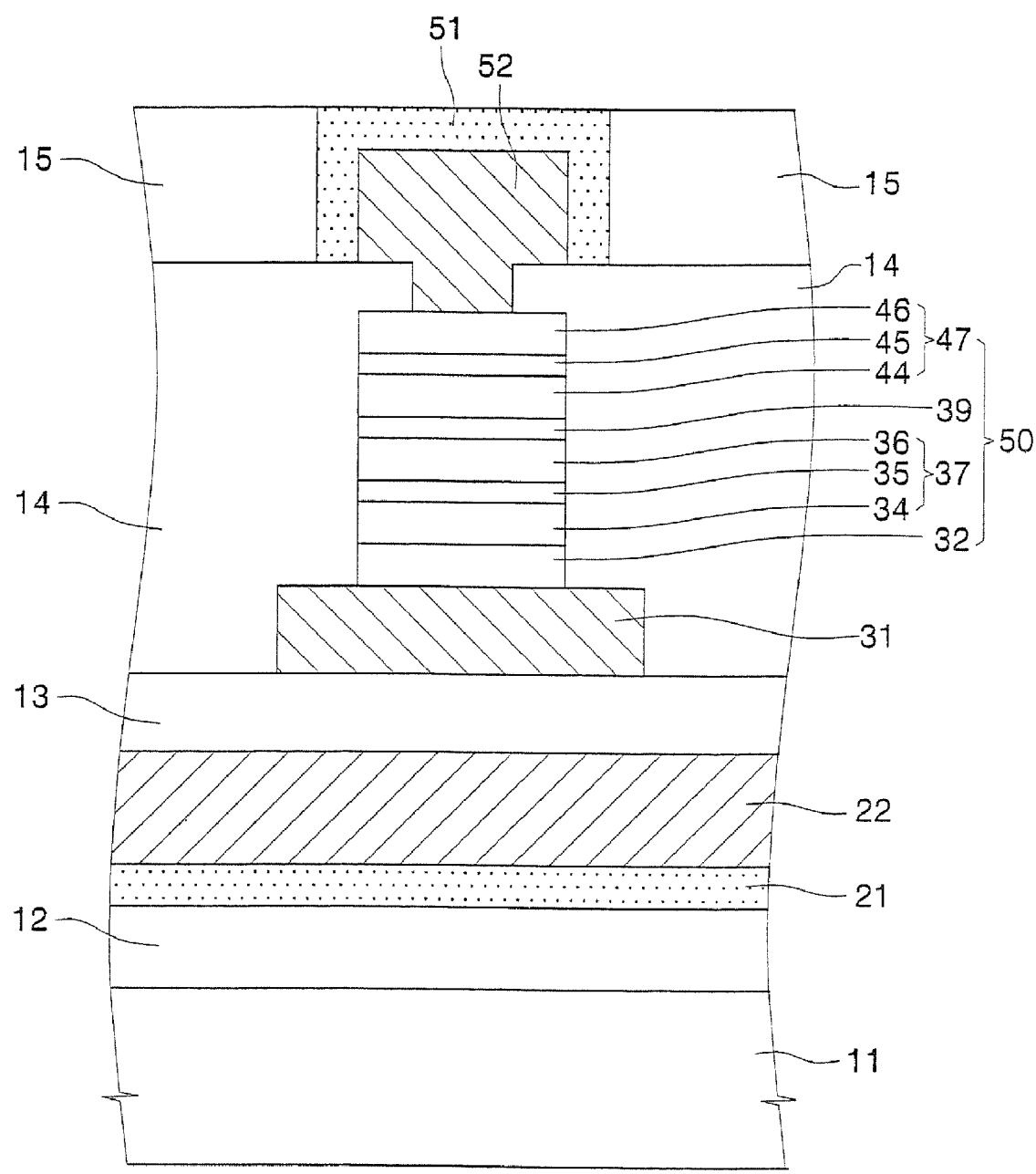
FIG. 4 is a cross-sectional view taken along the line II-II' of FIG. 2.

FIG. 2 is a plan view illustrating MRAM cells according to embodiments of the present invention, FIG. 3 is a cross-sectional view taken along the line I-I' of FIG. 2, and FIG. 4 is a cross-sectional view taken along the line II-II' of FIG. 2.

Referring to FIGS. 2, 3 and 4, a first inter layer dielectric layer 12 may be disposed on a predetermined region of a semiconductor substrate 11 including lower circuits (not shown). A digit line 22 may be disposed within the first inter layer dielectric layer 12. A bottom surface and sidewalls of the digit line 22 may be surrounded by a first magnetic layer pattern 21. The digit line 22 may be a conductive layer such as a copper layer and/or an aluminum layer. The first magnetic layer pattern 21 may be formed of a permanent magnet or an electromagnet. The permanent magnet may be formed of at least one material selected from a group consisting of Co, CoFe, and/or NiFe. A magnetic field generated by current flowing through the digit line 22 may be synthesized with that generated in the first magnetic layer pattern 21, thereby producing a larger synthesized magnetic field. As a result, a relatively large magnetic field may be generated with a relatively small current.

An entire surface of the semiconductor substrate including the digit line 22 may be covered by a second inter layer dielectric layer 13. A bottom electrode 31 may be disposed on the second inter layer dielectric layer 13 to pass over the digit line 22. The bottom electrode 31 may be electrically connected to a lower circuit through a contact hole (not shown) which penetrates the second inter layer dielectric layer 13.

An entire surface of the semiconductor substrate including the bottom electrode 31 may be covered by a third inter layer dielectric layer 14. A bit line 52 may be disposed on the third inter layer dielectric layer 14 to cross the digit line 22. A top surface and sidewalls of the bit line 52 may be surrounded by a second magnetic layer pattern 51. Both sides of the bit line 52 and the second magnetic layer pattern 51 may be surrounded by a top inter layer dielectric layer 15. The bit line 52 may be a conductive layer such as a copper layer or an aluminum layer. The second magnetic layer pattern 51 may be formed of a permanent magnet or an electromagnet. A permanent magnet may be formed of at least one material selected from a group consisting of Co, CoFe, and/or NiFe. A magnetic field generated by current flowing through the bit line 52 may be synthesized with that generated in the second magnetic layer pattern 51, thereby producing a larger synthesized magnetic field. As a result, a relatively large magnetic field may be generated with a relatively small current.

The bit line 52 and the bottom electrode 31 may be electrically connected by a MTJ 50 which penetrates the third inter layer dielectric layer 14. That is, the MTJ 50 is electrically connected between the bit line 52 and the bottom electrode 31. The MTJ 50 may include a pinning layer 32, a pinned layer 37, a tunneling insulating layer 39, and a synthetic anti-ferromagnetic (SAF) free layer 47 which are sequentially stacked.

The pinning layer 32 is an anti-ferromagnetic layer, and the pinned layer 37 is a ferromagnetic layer. As described above, the pinning layer 32 serves to fix the magnetization direction of the pinned layer 37. That is, the pinned layer 37 attached to the pinning layer 32 may have a relatively large switching field, and the magnetization direction of the pinned layer 37 may be fixed always in the same direction when an applied magnetic field is smaller than the switching field. The pinned layer 37 may have a structure composed of one ferromagnetic layer, or a SAF structure composed of three layers. An SAF structure may include a bottom pinned layer 34 and a top pinned layer 36 which are separated by a first exchange spacer layer 35. Each of the bottom pinned layer 34 and the top pinned layer 36 may be formed of a ferromagnetic layer. The first exchange spacer layer 35 may be a ruthenium (Ru) layer. An SAF structure has a characteristic that magnetization directions of the bottom and top pinned layers 34 and 36 are arranged to be anti-parallel to each other due to the effect of the first exchange spacer layer 35. That is, when an initial magnetization direction is applied to the bottom pinned layer 34 attached to the pinning layer 32, the magnetization direction of the top pinned layer 36 is arranged in an anti-parallel direction.

The tunneling insulating layer 39 may be an insulating layer such as an aluminum oxide layer. A read current for the MRAM cell flows through the tunneling insulating layer 39. An amount of the read current flowing through the tunneling insulating layer 39 may have a relatively high correlation with respect to a thickness of the tunneling insulating layer 39. Thus, the tunneling insulating layer 39 may have a relatively uniform thickness.

The SAF free layer 47 may include a bottom free layer 44 and a top free layer 46 which are separated by a second exchange spacer layer 45. Each of the bottom free layer 44 and the top free layer 46 may be formed of a ferromagnetic layer. The second exchange spacer layer 45 may be a Ru layer. The SAF free layer 47 may have a characteristic that magnetization directions of the bottom and top free layers 44 and 46 are arranged to be anti-parallel with respect to each other due to an effect of the second exchange spacer layer 45. In addition, a magnetization direction of the SAF free layer 47 may be changed by magnetic fields generated in the digit line 22 and the bit line 52.

Each of the ferromagnetic layers 34, 36, 44, and 46 may be formed of at least one material selected from a group consisting of Cobalt (Co), iron (Fe), and/or nickel (Ni), or may be formed of an alloy including at least two materials selected from the group.

The MTJ 50 may have an elliptical shape, a rectangular shape, a U-shape, a cross shape, or a shield shape when viewed in a plan view. In addition, the MTJ 50 may be disposed at an intersection of the digit line 22 and the bit line 52, may be disposed parallel to the digit line 22, may be disposed parallel to the bit line 52, or may be disposed to have an angle of intersection with the digit line 22 and the bit line 52. Alternatively, the MTJ 50 may be disposed to have an intersection angle of 45° with the digit line 22 and the bit line 52.

Figure 5:
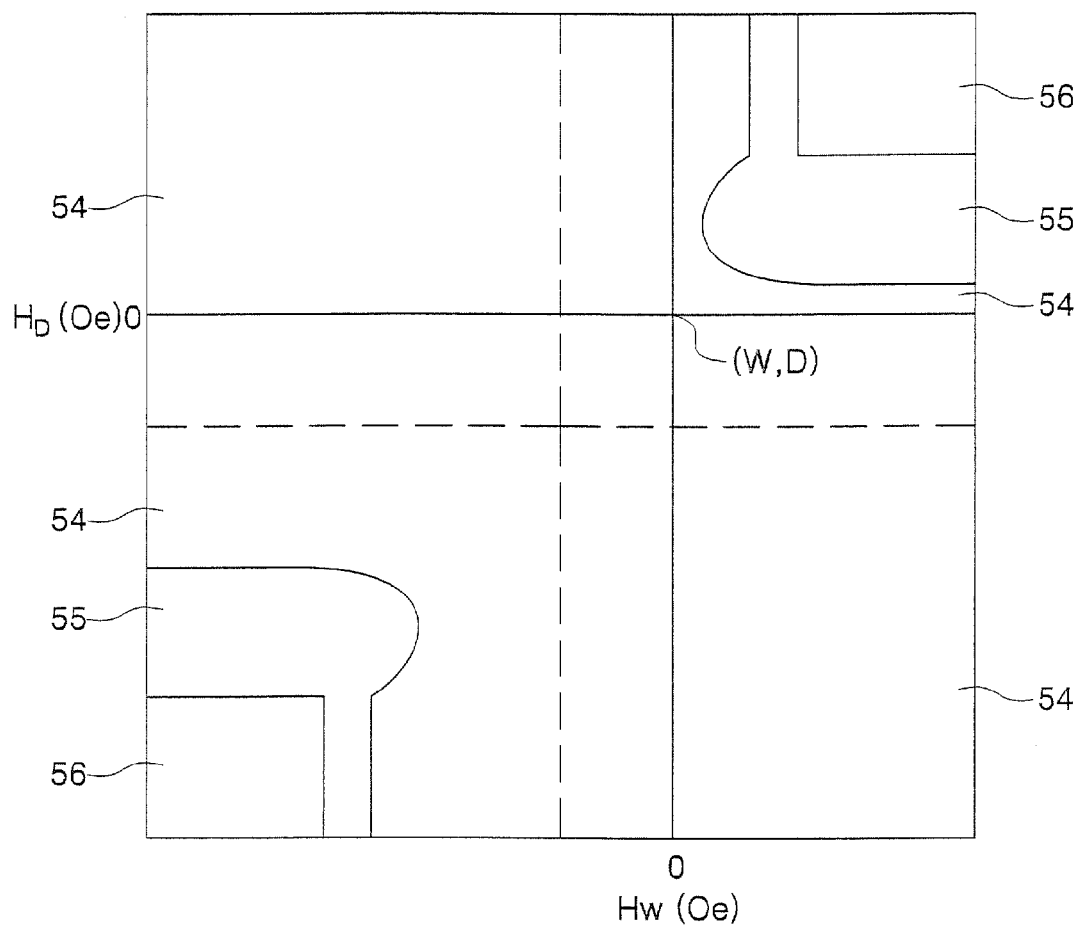
FIG. 5 is a switching characteristic diagram of an MRAM cell according to embodiments of the present invention.

FIG. 5 is a switching characteristic diagram of an MRAM cell according to embodiments of the present invention. Referring to FIG. 5, the horizontal axis indicates a magnetic field (Hw) generated by the bit line 52, and the magnetic field is measured in units of Oersted (Oe) which is a unit of magnetoresistance. The magnetic field generated by the bit line is proportional to the magnitude of the bit line current. The longitudinal axis indicates a magnetic field (Hw) generated by the digit line 22, and the magnetic field is measured in units of Oersted (Oe) which is a unit of magnetoresistance. The magnetic field generated by the bit line is proportional to the magnitude of the digit line current.

There are three types of regions in the switching characteristic diagram, i.e., no switching regions 54, direct switching regions 55, and toggle switching regions 56. The toggle switching regions 56 are present in the first quadrant and the third quadrant of the switching characteristic diagram. The direct switching regions 55 are also present in the first quadrant and the third quadrant. Regions of the first and third quadrants other than the toggle switching regions 56 and the direct switching regions 55 are no switching regions 54. The second and fourth quadrants have only the no switching regions 54. The switching region in the first quadrant is a region where the MTJ 50 is switched in response to the magnetic field induced when a positive current pulse is applied to each of the bit line 52 and the digit line 22. The switching region in the third quadrant is a region where the MTJ 50 is switched in response to the magnetic field induced when a negative current pulse is applied to each of the bit line 52 and the digit line 22.

Switching methods according to embodiments of the present invention may use the toggle switching regions 56. Writing methods using the toggle switching region 56 may begin with reading an initial state of the MTJ 50. For example, in the case that the initial state of the MTJ 50 is read as "1", when a bit line positive current pulse is applied to the bit line 52 and a digit line positive current pulse is applied to the digit line 22, the magnetization direction of the MTJ 50 may be changed to write a "0" state. Next, when the bit line positive current pulse is applied again to the bit line 52 and the digit line positive current pulse is applied again to the digit line 22, the magnetization direction of the MTJ is also changed to write a "1" state. In this case, the bit line positive current pulse and the digit line positive current pulse may be applied with a time delay, however, these pluses may be provided as a sequence which has an overlapped region therebetween. In addition, magnitudes of the current pulses may correspond to the toggle switching region 56.

Due to an effect of the magnetic field generated in the first and second magnetic layer patterns 21 and 51 which respectively surround the digit line 22 and the bit line 52, an origin of the switching characteristic diagram may be moved parallel to a point (W, D) in the first quadrant. Consequently, the digit line positive current pulse and the bit line positive current pulse may have a relatively small magnitude.

Alternatively, direct switching regions 55 may be used to change the magnetization direction of the MTJ 50. However, the direct switching regions 55 may have relatively narrow switching regions as shown in FIG. 5, and both of the positive current pulse and the negative current pulse may need to be used. Writing methods using the direct switching regions 55 may begin with reading an initial state of the MTJ 50. For example, in the case that the initial state of the MTJ 50 is read as "1", when the bit line positive current pulse is applied to the bit line 52 and the digit line positive current pulse is applied to the digit line 22, the magnetization direction of the MTJ 50 is changed to write a "0" state. Next, in order to change the state from "0" to "1", the bit line negative current pulse should be applied to the bit line 52 and the digit line negative current pulse should be applied to the digit line 22. In this case, the bit line negative current pulse and the digit line negative current pulse to be applied are present in the third quadrant as shown in FIG. 5, so that they may require a relatively high current. The relatively high current in turn may cause an increase in power consumption.

Figure 6:
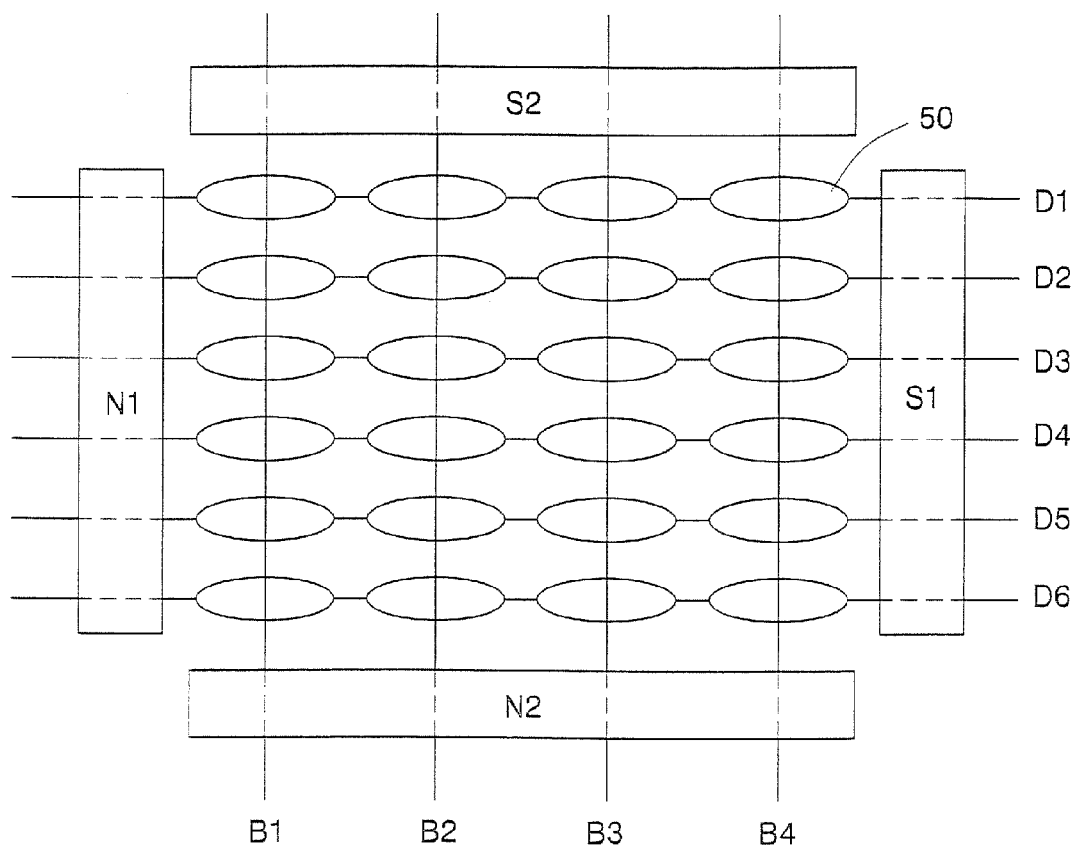
FIG. 6 is a plan view illustrating an MRAM according to other embodiments of the present invention.

FIG. 6 is a plan view illustrating an MRAM according to other embodiments of the present invention. Referring to FIG. 6, digit lines D1, D2, D3, D4, D5, and D6 are disposed above a predetermined region of a semiconductor substrate including lower circuits (not shown). Bottom surfaces and sidewalls of the digit lines D1, D2, D3, D4, D5, and D6 may be surrounded by respective first cladding patterns. Each of the digit lines D1, D2, D3, D4, D5, and D6 may be a conductive layer such as a copper layer and/or an aluminum layer. Each of the first cladding patterns may be a ferromagnetic layer such as NiFe. The first cladding patterns may serve to focus a magnetic flux generated by current flowing through the respective digit lines D1, D2, D3, D4, D5, and D6.

An entire surface of the semiconductor substrate having the digit lines D1, D2, D3, D4, D5, and D6 may be covered by a first inter layer dielectric layer. Bottom electrodes may be disposed on the first inter layer dielectric layer to pass over the digit lines D1, D2, D3, D4, D5, and D6. The bottom electrodes may be electrically connected to the lower circuits through contact holes which penetrate the first inter layer dielectric layer.

The entire surface of the semiconductor substrate including the bottom electrodes may be covered by a second inter layer dielectric layer. Bit lines B1, B2, B3, and B4 are disposed on the second inter layer dielectric layer to cross over the digit lines D1, D2, D3, D4, D5, and D6. Top surfaces and sidewalls of the bit lines B1, B2, B3, and B4 may be surrounded by second cladding patterns. Each of the bit lines B1, B2, B3, and B4 may be a conductive layer such as a copper layer and/or an aluminum layer. The second cladding patterns may be ferromagnetic layers such as NiFe. The second cladding patterns may serve to focus a magnetic flux generated by current flowing through the bit lines B1, B2, B3, and B4.

The bit lines B1, B2, B3, and B4 and the bottom electrodes may be connected through respective MTJs 50 which penetrate the second inter layer dielectric layer. Each MTJ 50 includes a pinning layer, a pinned layer, a tunneling insulating layer, and a synthetic anti-ferromagnetic (SAF) free layer which are sequentially stacked.

The pinning layer may be formed of an anti-ferromagnetic layer, and the pinned layer may be formed of a ferromagnetic layer. As described above, the pinning layer may fix the magnetization direction of the pinned layer. That is, the pinned layer attached to the pinning layer may have a relatively large switching field, and a magnetization direction of the pinned layer may always be fixed in a same direction when an applied magnetic field is smaller than the switching field. The pinned layer may have a structure including only one ferromagnetic layer, or a SAF structure including three layers. The SAF structure may include a bottom pinned layer and a top pinned layer which are separated by a first exchange spacer layer. Each of the bottom pinned layer and the top pinned layer may be formed of a ferromagnetic material. The first exchange spacer layer may be a Ru layer. The SAF structure may have a characteristic that the magnetization directions of the bottom and top pinned layers are arranged to be anti-parallel with respect to each other due to the effect of the first exchange spacer layer. That is, when an initial magnetization direction is applied to the bottom pinned layer attached to the pinning layer, the magnetization direction of the top pinned layer may be arranged in an anti-parallel direction. The tunneling insulating layer may be an insulating layer such as an aluminum oxide layer.

The SAF free layer may include a bottom free layer and a top free layer which are separated by a second exchange spacer layer. Each of the bottom and top free layers may be formed of a ferromagnetic layer. The second exchange spacer layer may be a Ru layer. The SAF free layer may have a characteristic that the magnetization directions of the bottom and top free layers are arranged to be anti-parallel with respect to each other due to the effect of the second exchange spacer layer. The ferromagnetic layers may be formed of at least one material selected from a group consisting of Co, Fe, and/or Ni, and/or may be formed of an alloy including at least two materials selected from the group.

In this case, the MTJ 50 may have an elliptical shape, a rectangular shape, a U-shape, a cross shape, or a shield shape when viewed in a plan view. In addition, the MTJs 50 may be disposed at respective intersections of the digit lines D1, D2, D3, D4, D5, and D6 and the bit lines B1, B2, B3, and B4. Moreover, MTJs 50 may be disposed parallel with respect to the digit lines D1, D2, D3, D4, D5, and D6; MTJs 50 may be disposed parallel with respect to the bit lines B1, B2, B3, and B4; or MTJs 50 may be disposed to have angles of intersection with respect to the digit lines D1, D2, D3, D4, D5, and D6 and the bit lines B1, B2, B3, and B4. In addition, the MTJs 50 may be disposed to have respective intersection angles of 45° with respect to the digit lines D1, D2, D3, D4, D5, and D6 and the bit lines B1, B2, B3, and B4. Consequently, an MRAM in accordance with other embodiments of the present invention may include a plurality of MTJs 50 which are interposed between respective digit lines D1, D2, D3, D4, D5, and D6 and bit lines B1, B2, B3, and B4.

An entire surface of the semiconductor substrate including the MTJs 50, the digit lines D1, D2, D3, D4, D5, and D6, and the bit lines B1, B2, B3, and B4 may be covered by a passivation insulating layer.

At least one pair of external magnets N1 and S1 may be disposed on the semiconductor substrate covered by the passivation insulating layer. In addition, two pairs of external magnets N1, S1, and N2, S2 may be disposed to be orthogonal with respect to each other as shown in FIG. 6. Alternatively, a plurality of pairs of the external magnets may be repeatedly disposed with predetermined intervals, respectively. Each external magnet may be a permanent magnet or an electromagnet. The external magnet(s) may move in parallel an origin of a switching characteristic diagram to a point near a toggle switching region as described with reference to FIG. 5. Consequently, magnetization directions of the MTJs 50 may be changed with only a relatively small current applied to the respective digit lines D1, D2, D3, D4, D5, and D6 and bit lines B1, B2, B3, and B4.

In MRAMs according to yet other embodiments of the present invention, a digit line may be disposed above a predetermined region of a semiconductor substrate having lower circuits (not shown) as described with reference to FIGS. 2, 3, and 4. A bottom surface and sidewalls of the digit line may be surrounded by a first magnetic layer pattern. The first magnetic layer pattern may be formed of a permanent magnet or an electromagnet. An entire surface of the semiconductor substrate having the digit line may be covered by an inter layer dielectric layer. A bottom electrode may be disposed on the inter layer dielectric layer to pass over the digit line. An entire surface of the semiconductor substrate including the bottom electrode may be covered by a second inter layer dielectric layer. A bit line may be disposed on the second inter layer dielectric layer to cross over the digit line. A top surface and sidewalls of the bit line may be surrounded by a second magnetic layer pattern. The second magnetic layer pattern may be formed of a permanent magnet or an electromagnet. A bit line and a bottom electrode may be connected to each other through a MTJ which penetrates the second inter layer dielectrics. Each MTJ may include a pinning layer, a pinned layer, a tunneling insulating layer, and a SAF free layer which are sequentially stacked.

MRAMs according to yet other embodiments of the present invention may include a plurality of MTJs interposed between respective digit and bit lines. An entire surface of the semiconductor substrate including the MTJs, the digit lines, and the bit lines may be covered by an insulating passivation layer.

At least one pair of external magnets may be disposed on the semiconductor substrate covered by the insulating passivation layer. In addition, two pairs of external magnets may be disposed to be orthogonal with respect to each other as shown in FIG. 6. Alternatively, a plurality of pairs of the external magnets may be repeatedly disposed with predetermined intervals, respectively. The external magnet may be a permanent magnet or an electromagnet. By means of the first and second magnetic layer patterns and the external magnet, an origin of a switching characteristic diagram may be moved parallel to a point relatively near the toggle switching region. As a result, magnetization directions of the MTJs may be changed with a relatively small current applied to the digit lines and the bit lines.

According to embodiments of the present invention discussed above, a bottom surface and sidewalls of a digit line may be surrounded by a first magnetic layer pattern, and a top surface and sidewalls of a bit line may be surrounded by a second magnetic layer pattern. A magnetic field generated by current flowing through the digit line may be synthesized with that generated by the first magnetic layer pattern, thereby producing a larger synthesized magnetic field. Similarly, a magnetic field generated by current flowing through the bit line may also be synthesized with that generated by the second magnetic layer pattern, thereby producing a larger synthesized magnetic field. In addition, an external magnet may be added above the bit line. Moreover, a magnetization direction of the MTJ having a SAF free layer may be changed using a toggle switching region. In this case, the origin of the switching characteristic diagram may be moved parallel to a point near the toggle switching region by means of the first and second magnetic layer patterns and the external magnet. As a result, magnetization directions of the MTJs may be changed with relatively small currents applied to the digit line and the bit line.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of writing to a magnetic random access memory (MRAM), the method comprising:
    providing a first magnetic layer on a substrate, a digit line on the first magnetic layer, a magnetic tunnel junction structure adjacent the digit line, a bit line on the magnetic tunnel junction structure such that the magnetic tunnel junction structure is between the bit line and the digit line, and a second magnetic layer on the bit line, wherein at least one of the first magnetic layer and/or the second magnetic layer comprises a permanent magnet, wherein a longest dimension of the magnetic tunnel junction structure is non-parallel and non-orthogonal with respect to the digit line and non-parallel and non-orthogonal with respect to the bit line;
    reading an initial state of the magnetic tunnel junction structure as "1" or "0";
    when the initial state is read as "1", applying a first current pulse to the bit line and a second current pulse to the digit line; and
    when the initial state is read as "0", applying a third current pulse to the bit line and a fourth current pulse to the digit line, wherein the third current pulse is same direction of the first current pulse and the fourth current pulse is same direction of the second current pulse.

2. The method according to claim 1, wherein the longest dimension of the magnetic tunnel junction structure is arranged at a 45 degree angle with respect to the digit line and at a 45 degree angle with respect to the bit line.

3. The method according to claim 1, wherein the magnetic tunnel junction structure includes a synthetic anti-ferromagnetic (SAF) free layer.

4. The method according to claim 3, wherein the synthetic anti-ferromagnetic (SAF) free layer includes an exchange spacer layer between first and second free layers such that the first free layer is between the exchange spacer layer and the digit line.

5. The method according to claim 3, wherein the magnetic tunnel junction structure includes a tunneling insulating layer between the synthetic anti-ferromagnetic free layer and the digit line, a pinned layer between the tunneling insulating layer and the digit line, and a pinning layer between the pinned layer and the digit line.

6. The method according to claim 1, wherein portions of the first magnetic layer are between the digit line and the substrate and wherein portions of the first magnetic layer extend on sidewalls of the digit line.

7. The method according to claim 1, wherein the bit line is between portions of the second magnetic layer and the substrate and wherein portions of the second magnetic layer extend on sidewalls of the bit line.

8. The method according to claim 1, wherein at least one of the first magnetic layer and/or the second magnetic layer comprises at least one of Co, CoFe and/or NiFe.

9. The method according to claim 1, further comprising:
an insulating passivation layer on the bit line such that the bit line is between the insulating passivation layer and the substrate; and
at least two magnets on the insulating passivation layer such that the insulating passivation layer is between the at least two magnets and the substrate.

10. The method according to claim 9, wherein each of the at least two magnets comprises a permanent magnet and/or an electromagnet.

* * * * *